United States Patent [19]

Abraham et al.

[11] Patent Number: 6,104,633
[45] Date of Patent: Aug. 15, 2000

[54] INTENTIONAL ASYMMETRY IMPOSED DURING FABRICATION AND/OR ACCESS OF MAGNETIC TUNNEL JUNCTION DEVICES

[75] Inventors: David William Abraham, Ossining; William Joseph Gallagher, Ardsley; Philip Louis Trouilloud, Mahwah, all of N.Y.

[73] Assignee: International Business Machines Corporation, Armonk, N.Y.

[21] Appl. No.: 09/021,515

[22] Filed: Feb. 10, 1998

[51] Int. Cl.[7] .................................................. G11C 11/14
[52] U.S. Cl. ............................................ 365/171; 365/173
[58] Field of Search .................................... 365/171, 173, 365/55, 66

[56] References Cited

U.S. PATENT DOCUMENTS

| | | | |
|---|---|---|---|
| 5,341,118 | 8/1994 | Parkin et al. | 338/32 R |
| 5,408,377 | 4/1995 | Gurney et al. | 360/113 |
| 5,640,343 | 6/1997 | Gallagher et al. | 365/171 |
| 5,650,958 | 7/1997 | Gallagher et al. | 365/173 |
| 5,838,608 | 11/1998 | Zhu | 365/173 |
| 5,946,228 | 8/1999 | Abraham | 365/173 |

OTHER PUBLICATIONS

Fernandex, P.J., et al., "Magnetic Force Microscopy of Single–Domain Cobalt Dots Patterned Using Interference Lithography," IEEE Transactions on Magnetics, vol. 32, No. 5, (Sep. 1996), pp. 4472–4474.

Zheng, Y. & Zhu, J., "Micromagnetic Pinciples in Pseudo Spin Valve Memory Element Design," IEEE Transactions on Magnetics, vol. 33, No. 5, (Sep. 1997), pp. 3286–3288.

*Primary Examiner*—A. Zarabian
*Attorney, Agent, or Firm*—Heslin & Rothenberg, P.C.

[57] ABSTRACT

Magnetic memory cells include a changeable magnetic region with a magnetic axis along which two directions of magnetization can be imposed, thereby providing two respective states into which the cells are changeable according to electrical and resultant magnetic stimuli applied thereto. Asymmetry in the magnetic stimuli applied to the cell while writing a state therein is disclosed to provide a predictable magnetization pattern evolution from the first direction to the second direction. Physical asymmetry in the layout and/or magnetization of the cell is also disclosed which provides the predictable pattern evolution. These principles can be applied to magnetic random access memory (MRAM) arrays which employ magnetic tunnel junction (MTJ) cells at the intersections of bitlines and wordlines which supply the electrical and resultant magnetic stimuli to write the cells therein.

23 Claims, 11 Drawing Sheets fig. 1a
PRIOR ART

BIT LINES
WORD LINES fig. 1b
PRIOR ART fig. 2
PRIOR ART fig. 4

130  132  134 fig. 3 fig. 5 fig. 6a fig. 6b fig. 7 fig. 8a fig. 8b fig. 9 fig. 10 fig. 11a fig. 11b fig. 12a    fig. 12b fig. 13 fig. 14

INTENTIONAL ASYMMETRY IMPOSED DURING FABRICATION AND/OR ACCESS OF MAGNETIC TUNNEL JUNCTION DEVICES

CROSS REFERENCE TO RELATED APPLICATIONS

This Application relates to the following commonly assigned, issued U.S. Patents:

1. U.S. Pat. No. 5,640,343, issued Jun. 17, 1997 and entitled "MAGNETIC MEMORY ARRAY USING MAGNETIC TUNNEL JUNCTION DEVICES IN THE MEMORY CELLS"; and
2. U.S. Pat. No. : 5,650,958, issued Jul. 22, 1997 and entitled "MAGNETIC TUNNEL JUNCTIONS WITH CONTROLLED MAGNETIC RESPONSE."

This Application relates to the following commonly assigned, concurrently filed U.S. Patent Applications:

1. application Ser. No.: 09/021,342, filed Feb. 10, 1998, and entitled, "MAGNETIC MEMORY DEVICES HAVING MULTIPLE MAGNETIC TUNNEL JUNCTIONS THEREIN";
2. application Ser. No.: 09/021,352, filed Feb. 10, 1998, and entitled, "LIMITING MAGNETORESISTIVE ELECTRICAL INTERACTION TO A PREFERRED PORTION OF A CHANGEABLE MAGNETIC REGION IN MAGNETIC DEVICES"; and
3. application Ser. No.: 09/021,569, filed Feb. 10, 1998, now U.S. Pat. No. 5,946,228, issued Aug. 31, 1999, and entitled, "LIMITING MAGNETIC WRITING FIELDS TO A PREFERRED PORTION OF A CHANGEABLE MAGNETIC REGION IN MAGNETIC DEVICES."

Each of these U.S. Patents and U.S. Patent Applications is hereby incorporated by reference herein in its entirety.

STATEMENT OF GOVERNMENT RIGHTS

The Government of the United States of America has rights in this invention pursuant to Contract No. MDA972-96-C-0030 awarded by the Defense Advanced Research Projects Agency.

TECHNICAL FIELD

This invention relates to the fabrication and access of magnetic memory cells in a magnetic random access memory ("MRAM").

BACKGROUND OF THE INVENTION

Figure 1A:
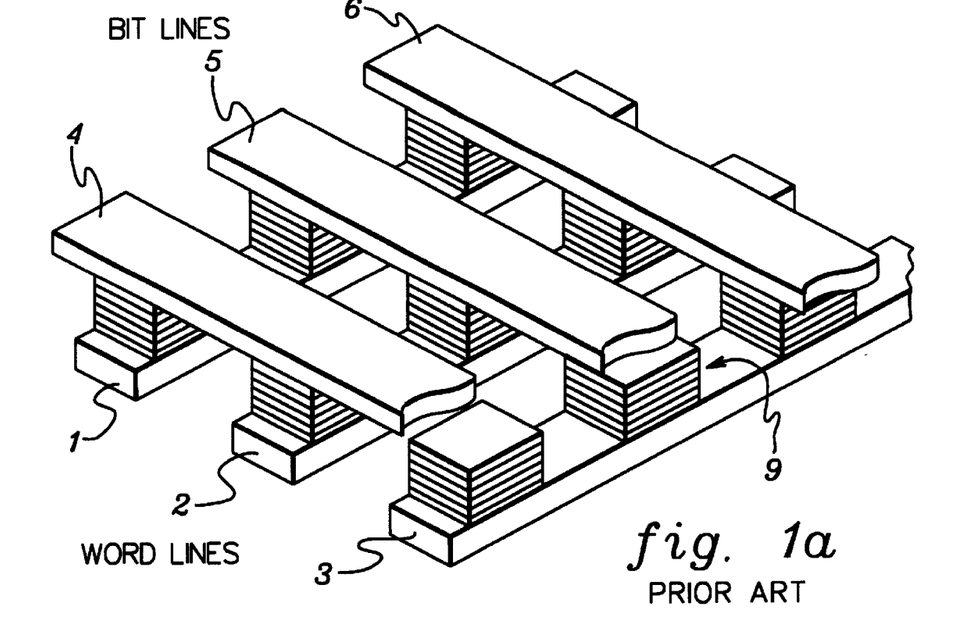
FIGS. 1a–b depict an MRAM array having a plurality of magnetic memory cells at the intersections of crossing bitlines and wordlines, and an individual magnetic tunnel junction memory cell, respectively.
Figure 1B:
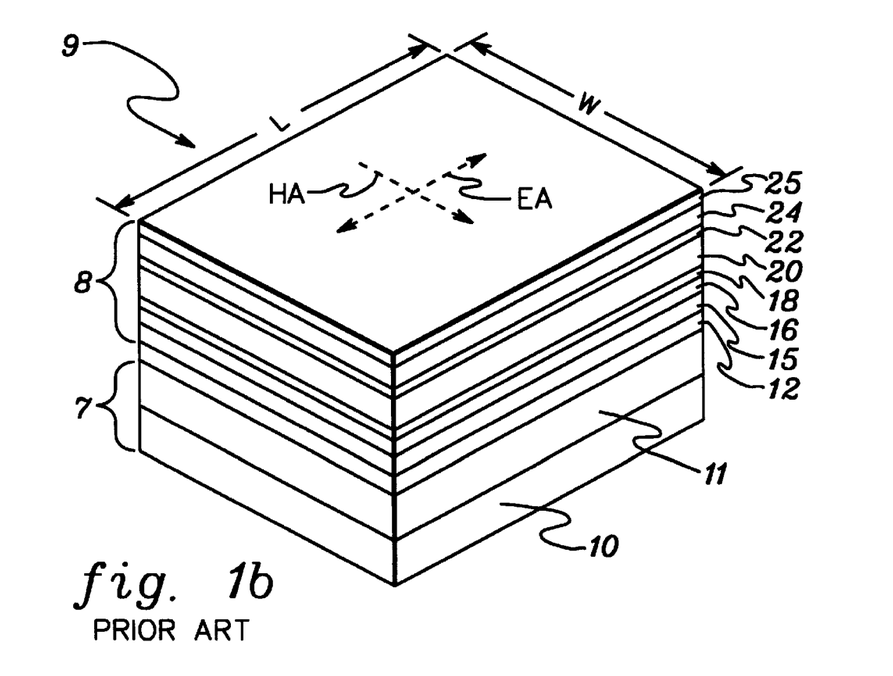

Magnetic Random Access Memory ("MRAM") arrays of the type disclosed in the two above-incorporated U.S. Patents, and depicted in FIGS. 1a–b herein, include an array of magnetic memory cells (e.g., cell 9) positioned at the intersections of wordlines 1, 2, 3 and bitlines 4, 5, 6. Each cell includes a magnetically changeable or free region 24, and a proximate reference region 20, arranged into a magnetic tunnel junction ("MTJ") device 8. The principle underlying storage of data in such cells is the ability to change the relative orientation of the magnetization of the free and reference regions by changing the direction of magnetization along the easy axis ("EA") of the free region, and the ability to thereafter read this relative orientation difference. (The term reference region is used broadly herein to denote any type of region which, in cooperation with the free or changeable region, results in a detectable state of the device as a whole.)

More particularly, MRAM cells are written by reversing the free region magnetization using applied bi-directional electrical and resultant magnetic stimuli via its respective bitline and wordline, and are later read by measuring the resultant tunneling resistance between the bitline and wordline, which assumes one of two values depending on the relative orientation of the magnetization of the free region with respect to the reference region. If the free region is modeled as a simple elemental magnet having a direction of magnetization which is free to rotate but with a strong preference for aligning in either direction along its easy axis (+EA or −EA), and if the reference region is, for example, a similar elemental magnet but having a direction of magnetization fixed in the +EA direction, then two states (and therefore the two possible tunneling resistance values) are defined for the cell: aligned (+EA/+EA) and anti-aligned (−EA/+EA).

Figure 2:
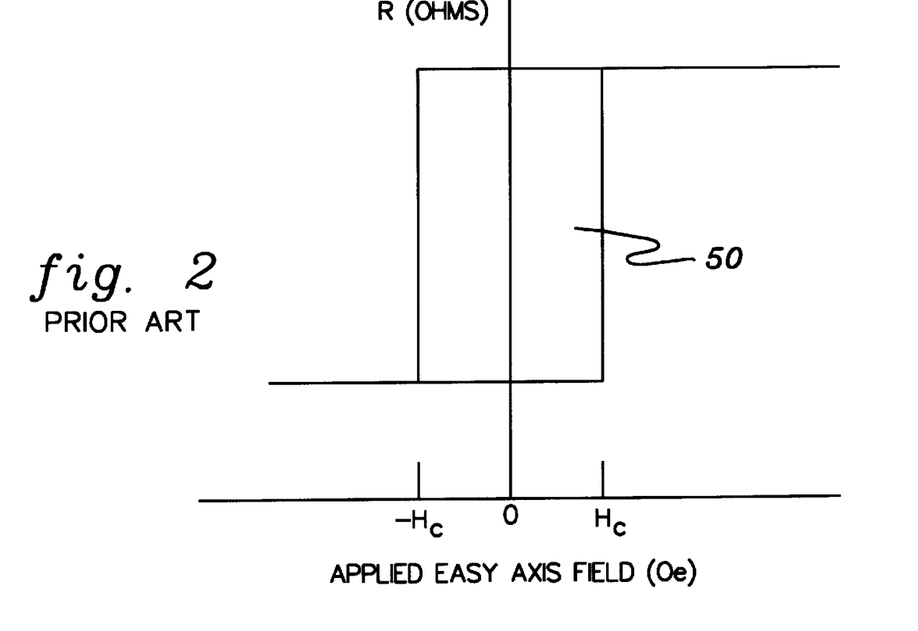
FIG. 2 is an ideal hysteresis loop of the measured resistance versus applied easy axis field for an ideal magnetic tunnel junction memory cell.

An ideal hysteresis loop characterizing the tunnel junction resistance with respect to the applied EA field is show in FIG. 2. The resistance of the tunnel junction can assume one of two distinct values with no applied stimulus in region 50, i.e., there is a lack of sensitivity of resistance to applied field below the easy axis flipping field strength $+/-H_c$ in region 50. If the applied easy axis field exceeds $+/-H_c$, then the cell is coerced into its respective high or low resistance state.

Even if the magnetization pattern of the two regions forming the tunnel junction is simple, reversing the direction of magnetization in the free region during writing can actually affect one or both regions in unexpected ways. For example, the reversal of the free region during writing can result in the inclusion of a magnetic vortex or complex magnetic domain walls, pinned by a defect or by edge roughness. Because the junction resistance depends on the dot product $m_{free} m_{reference}$ averaged over the junction area, inclusion of such complex micromagnetic structures in the magnetization pattern can substantially corrupt the measured tunnel junction resistance during reading.

Figure 3:
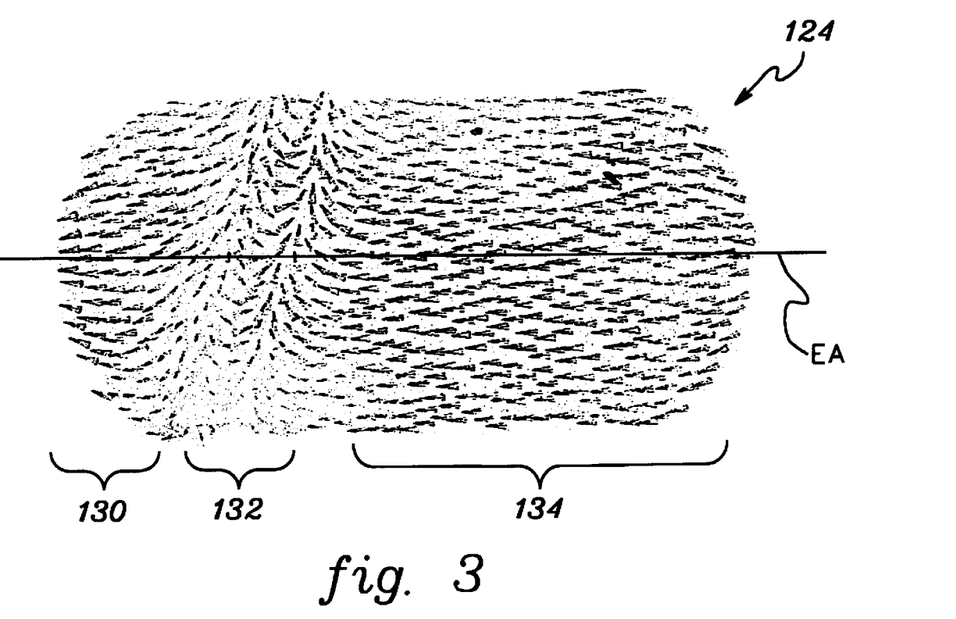
FIG. 3 depicts a magnetization pattern of a sample, symmetric magnetic memory cell having a complex micromagnetic wall structure therein.
Figure 4:
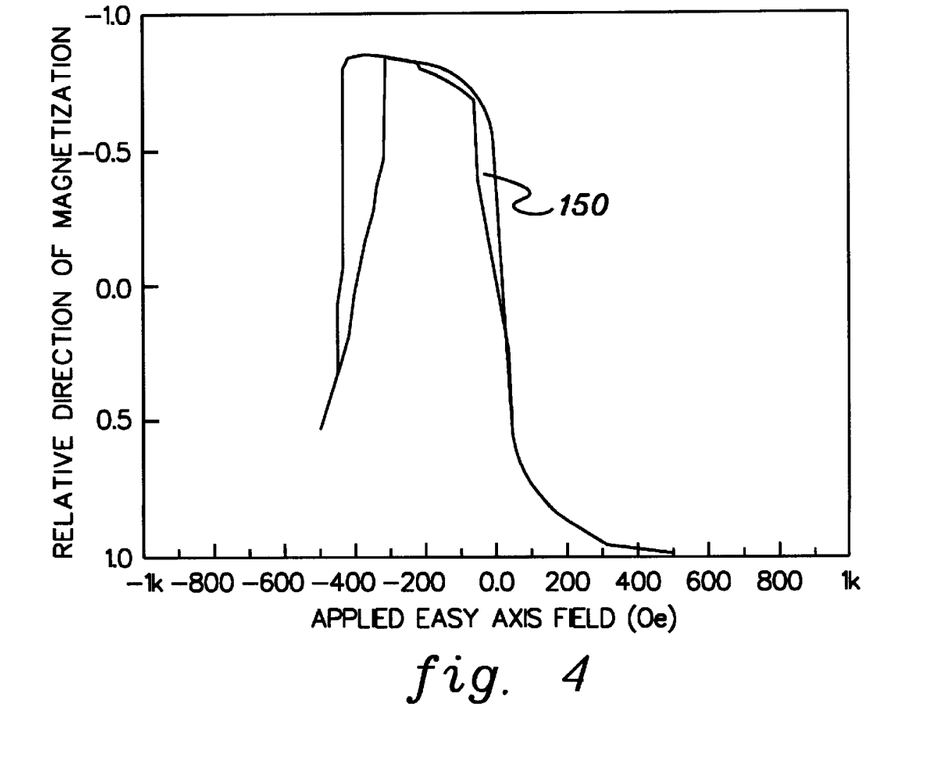
FIG. 4 is a calculated hysteresis loop of the sample magnetic memory cell of FIG. 3.

For example, shown in FIG. 3 is the magnetization pattern in the free region 124 of an MRAM cell formed symmetrically about its easy axis EA in which a complicated wall structure 132 is clearly evident between otherwise acceptable magnetization pattern regions 130 and 134. This overall magnetization pattern was attained from a nominally uniformly magnetized sample (both top and bottom layers originally pointing to the right), for which the easy axis bias was swept from +700 Oe to −700 Oe and back to +700 Oe. The reversal of magnetization evolved to complicated structure 132 as the field was swept from +700 Oe down to −60 Oe. FIG. 4 is a hysteresis loop depicting the relative direction of magnetization versus applied easy axis field for this corrupt sample. The non-square nature of region 150, results in a cell which will not predictably assume either one of its two states upon the removal of the easy axis applied field, is due to the evolution of such complex micromagnetic structures in the cell.

These undesirable magnetic structures decrease the parametric window of operation of the cell at best, or result in a total collapse of the square hysteresis loop necessary for storage at worst. In addition, the presence of such structures can be expected to cause the switching lines required to reverse, or substantially reverse, the free region to increase in size and/or power.

What are required, therefore, are techniques which eliminate such complex micromagnetic structures when changing the state of a magnetic memory cell in an MRAM array.

SUMMARY OF THE INVENTION

To overcome the deficiencies of the magnetic memory cells identified above, the present invention relates to, in one aspect, a magnetic memory having first and second crossing conductive lines forming an intersecting region. A magnetic memory cell is positioned at the intersecting region and includes a changeable magnetic region with a magnetic axis along which two directions of magnetization can be imposed, thereby providing two respective states into which the cell is changeable. The cell is changeable into the two respective states according to magnetic stimuli applied thereto via the first and second crossing conductive lines. The changeable magnetic region is formed to be substantially magnetically asymmetrically shaped about its magnetic axis, therefore allowing the magnetization pattern to evolve properly during writing, without the formation of the complex micromagnetic structures discussed above.

The changeable magnetic region of the cell may be shaped as a substantially planar parallelogram about its magnetic axis, with non-right angles in the corners thereof. Alternatively, or in combination, the changeable magnetic region can be magnetically asymmetrically shaped about its magnetic axis via a built-in magnetic anisotropy, possibly using proximate bias regions.

In another aspect, the present invention relates to a magnetic memory having first and second crossing conductive lines forming an intersecting region. As set forth above, a magnetic memory cell is positioned at the intersecting region and has a magnetic axis along which two directions of magnetization can be imposed thereby providing two respective states into which the cell is changeable according to magnetic stimuli applied thereto via the first and second crossing conductive lines. The cell is positioned in the intersecting region such that its magnetic axis is non-parallel to either the first or second crossing conductive line. In one embodiment, the magnetic axis forms an angle of greater than about 5 degrees with either the first or second crossing conductive line.

In addition to the above-discussed techniques of physically imposing an intentional asymmetry about the magnetic axis of the memory cell, the present invention also relates to arranging the applied magnetic stimuli to the cell from the first and second conductive lines such that the magnetic stimuli is applied thereto asymmetrically in accordance with the relative amplitude and/or timing of the magnetic fields applied by each respective conductive line.

In one embodiment, a bias field is applied using the wordline, and the bitline is swept from a low value to a high value while the bias value is applied. In another embodiment, both lines are swept simultaneously from respective low values to respective high values, but at differing amplitudes, e.g., the wordline at 10% of the value of the bitline. This applied stimulus asymmetry has also been shown to allow the magnetization patterns to evolve properly during writing.

Using the above-discussed techniques, i.e., a physical asymmetry, and/or stimulus asymmetry, the magnetization patterns in the free region of the magnetic memory cells can be expected to reverse from one state into another without the formation of undesirable, complex micromagnetic structures. Overall performance of the cell is improved, since the tunneling resistance of the cell will predictably assume one of two values when the applied writing fields are removed.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following detailed description of the preferred embodiment(s) and the accompanying drawings in which:

FIGS. 6a–h are respective timing diagrams for easy and hard axis fields applied during the writing of a magnetic memory cell, in accordance with alternate embodiments of the stimulus asymmetry of the present invention;

DETAILED DESCRIPTION OF THE PREFERRED EMBODIMENTS

Disclosed herein are techniques for overcoming the above-discussed problems associated with magnetization reversal in MRAM cells. The techniques involve built-in asymmetry in the writing stimuli, physical design, or both, of the MRAM cell, which substantially improve the magnetization reversal process. The asymmetry can be achieved in a variety of ways, including asymmetric magnetic writing stimuli (applied, e.g., "off-axis" using a constant hard-axis field applied along with a swept easy-axis field, or at an angle to the easy axis using simultaneously swept easy axis and hard axis fields). Physical junction asymmetry is also disclosed using patterned thin film shape asymmetry, cell non-alignment with associated bitlines or wordlines, or built-in anisotropy in the junction region which breaks the junction shape or magnetization symmetry about its axis.

The principles of the present invention regarding built-in asymmetry are discussed below with reference to FIGS. 6–12. However, by way of background, the general principles underlying the formation and operation of the memory array depicted in FIGS. 1a–b are first briefly discussed, in accordance with the above-incorporated U.S. Pat. Nos. 5,640,343 and 5,650,958.

With reference to FIG. 1a, an exemplary MRAM array includes a set of electrically conductive lines that function as parallel word lines 1, 2, and 3 in a horizontal plane, and a set of electrically conductive lines that function as parallel bit lines 4, 5, and 6 in another horizontal plane. The bit lines are oriented in a different direction, e.g., at right angles to the word lines, so that the two sets of lines intersect when viewed from above. A memory cell, such as typical memory cell 9 shown in detail in FIG. 1b, is located at each crossing point of the word lines and bit lines in the intersection region vertically spaced between the lines. Three word lines and three bit lines are illustrated in FIG. 1a, but the number of lines would typically be much larger. The memory cell 9 is arranged in a vertical stack and may include a diode 7 and a magnetic tunnel junction ("MTJ") 8. During operation of the array, current flows in a vertical direction through the cell 9. The vertical current path through the memory cell permits the memory cell to occupy a very small surface area. Contact to the word lines, the MTJ, the diode, and the contact to the bit line all occupy the same area. While not shown in FIG. 1a, the array may be formed on a substrate, such as a silicon substrate on which there would be other circuitry. Also, a layer of insulating material is usually located between the bit lines and word lines at regions of the MRAM other than the intersecting regions.

The structure of the memory cell 9 is described in more detail with reference to FIG. 1b. The memory cell 9 is formed on and in contact with a word line 3 (FIG. 1a). The memory cell 9 comprises a vertical stack of a diode-like device, e.g., silicon junction diode 7, and an MTJ 8 in electrical series connection. The diode 7 is a silicon junction diode that comprises an n-type silicon layer 10 and a p-type silicon layer 11. The diode's p-type silicon layer 11 is connected to the MTJ 8 via a tungsten stud 12. The diode's n-type silicon layer 10 is connected to word line 3.

The MTJ 8 may be formed of a series of layers of material stacked one on top of the other. The MTJ 8 of FIG. 1b comprises a template layer 15, such as Pt, an initial ferromagnetic layer 16, such as permalloy (Ni—Fe), an antiferromagnetic layer (AF) 18, such as Mn—Fe, a fixed or "pinned" type of reference ferromagnetic layer (FMF) 20, such as Co—Fe or permalloy, a thin tunneling barrier layer 22 of alumina ($Al_2O_3$), a soft, changeable "free" ferromagnetic layer (FMS) 24, such as a sandwich of thin Co, Fe with permalloy, and a contact layer 25, such as Pt.

The free layer is fabricated to have a preferred axis for the direction of magnetization called the easy axis ("EA"). There are two possible directions of magnetization of the free layer along this easy axis which define the two states of the memory cell. In contrast, the reference layer may be fabricated to have only one preferred direction of magnetization, called its unidirectional anisotropy direction, and this direction is parallel to the easy axis of the free layer. The desired easy axis for the free layer is set by some combination of intrinsic anisotropy, strain-induced anisotropy and shape anisotropy of the MTJ. The MTJ and free layer depicted may be made in the shape of a rectangle of length L and width W, where L is larger than W (FIG. 1b). The magnetic moment of the free layer prefers to align along the direction of L.

The unidirectional anisotropy direction of the reference layer is set by growing the Fe—Mn AF layer 18 on the initial ferromagnetic layer 16, which is itself grown on the template layer 15, such as Pt or Cu or Ta. The template layer 15 induces a 111 crystallographic texture in the initial ferromagnetic layer 16. These layers are deposited in a magnetic field directed parallel to the desired easy axis of the free layer, creating the desired intrinsic unidirectional anisotropy direction of the reference layer. Alternatively, the AF layer can be deposited on the template layer in a sufficiently large magnetic field parallel to the said easy axis while heating the substrate to a temperature higher than the blocking temperature of the AF material. In this alternative, the initial ferromagnetic layer 16 is not required. It is also possible to take advantage of the magnetostriction of the fixed layer to develop, during processing, a magnetic anisotropy which aligns magnetization along the applied magnetic field direction during deposition.

Because of exchange coupling between the reference and AF layers, the magnetization direction of the reference layer is more difficult to change than that of the free layer. In the range of fields applied by currents through the bit and word lines, the magnetization direction of the reference layer is fixed or pinned, in this embodiment. Shape anisotropy of the reference layer, which follows the shape anisotropy of the MTJ, provides additional stability of the magnetization direction of the fixed layer. The magnetic fields applied to write the memory cell are large enough to reverse the direction of magnetization of the free layer, but not the direction of the reference layer. Thus, the magnetization of the fixed layer does not change direction during operation of the memory cells in the MRAM.

During array operation, when a sufficiently large current is passed through both a write line and a bit line of the MRAM, the self-field of the combined current at the intersection of the write and bit lines will rotate the magnetization of the free layer of the single particular MTJ located at the intersection of the energized write and bit lines. The current levels are designed so that the combined self-field exceeds the switching field of the free layer. This self-field is designed to be much smaller than the field required to rotate the magnetization of the reference layer. The cell array architecture is designed so that the write currents do not pass through the MTJ itself. The memory cell is read by passing a sense current perpendicularly through the diode and MTJ from the reference layer through the tunnel junction barrier to the free layer (or vice versa). Since the resistance of the $Al_2O_3$ tunnel barrier is strongly dependent on the thickness of the $Al_2O_3$ layer, approximately varying exponentially with the thickness of this layer, this means that the electrical current largely flows perpendicularly through the $Al_2O_3$ tunnel barrier. The probability of a charge carrier tunneling across the barrier falls off strongly with increasing $Al_2O_3$ thickness so the only carriers that tunnel across the junction are those which traverse perpendicular to the junction layer. The state of the memory cell is determined by measuring the resistance of the memory cell when a sense current, much smaller than the write currents, is passed perpendicularly through the MTJ. The self-field of this sense or read current is negligible and does not affect the magnetic state of the memory cell. The probability of tunneling of charge carriers across the tunnel barrier depends on the relative alignment of the magnetic moments of the free and the reference layers. The tunneling current is spin polarized, which means that the electrical current passing from one of the ferromagnetic layers, for example, the fixed layer, is predominantly composed of electrons of one spin type (spin up or spin down, depending on the orientation of the magnetization of the ferromagnetic layer). The degree of spin polarization of the current is determined by the electronic band structure of the magnetic material comprising the ferromagnetic layer at the interface of the ferromagnetic layer with the tunnel barrier. The first ferromagnetic layer tunnel barrier thus acts as a spin filter. The probability of tunneling of the charge carriers depends on the availability of electronic states of the same spin polarization as the spin polarization of the electrical current in the second it ferromagnetic layer. Usually, when the magnetic moment of the second ferromagnetic layer is aligned to the magnetic moment of the first ferromagnetic layer, there are more available electronic states than when the magnetic moment of the second ferromagnetic layer is aligned anti-aligned to that of the first ferromagnetic layer. Thus, the tunneling probability of the charge carriers is highest when the magnetic moments of both layers are aligned, and is lowest when the magnetic moments are anti-aligned. When the moments are arranged, neither aligned nor anti-aligned, the tunneling probability takes an intermediate value. Thus, the electrical resistance of the cell depends on both the spin polarization of the electrical current and the electronic states in both of the ferromagnetic layers. As a result, the two possible magnetization directions of the free layer uniquely define two possible bit states (0 or 1) of the memory cell.

Figure 5:
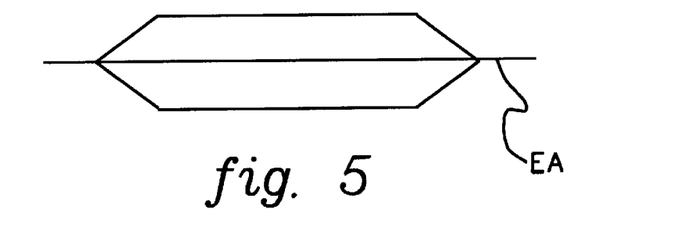
FIG. 5 is a top view of the geometry of a sample magnetic memory cell symmetric about its easy axis, used to validate the stimulus asymmetry techniques of the present invention.

In accordance with the present invention, a form of stimulus asymmetry, i.e., "off-axis" magnetic bias, is considered first herein. In that regard, experimental and simulation results of asymmetry realized using a swept easy axis field along with a constant, perpendicular hard axis field are presented with reference to FIGS. 5, 6a, 7 and 8a–b. FIG. 5 is a top view of a symmetric j unction shape used to verify this technique. In accordance with the present invention, and with reference to the timing diagram of FIG. 6a, easy axis field value 210 is swept from a neutral to a positive (coercive) value along slope 215, thereby rotating the magnetization. Hard axis field 220 is kept constant 225 during this sweep period. Asymmetric "off-axis" magnetic bias is thus provided to rotate the magnetization and therefore write a state to the cell.

Figure 7:
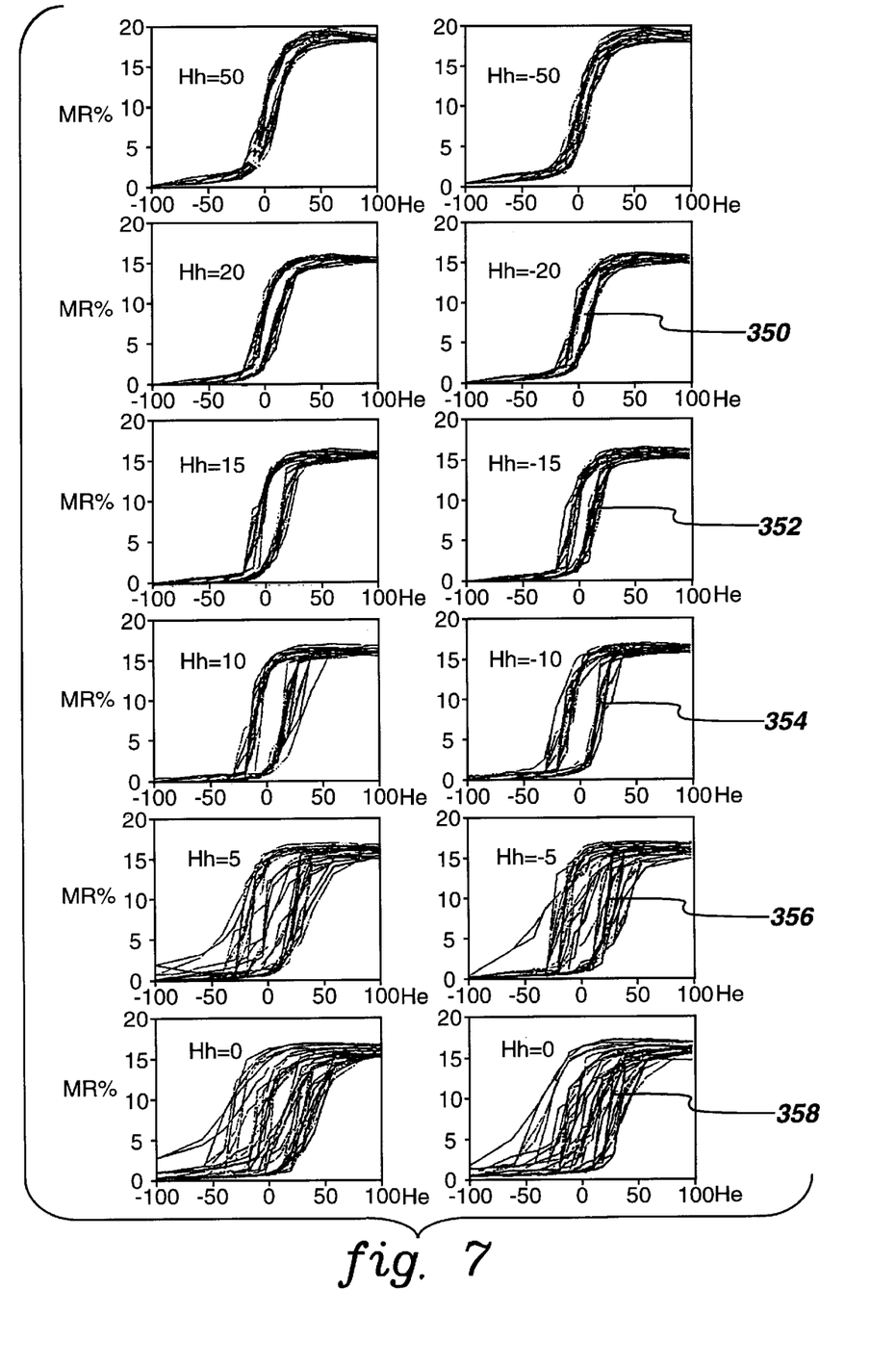
FIG. 7 is an array of hysteresis loops measured using different respective values of the constant hard axis bias field of FIG. 6a for the sample of FIG. 5.

FIG. 7 is an array of hysteresis loops measured for 14 similarly shaped junctions, for respective values of a constant hard axis bias, Hh, from 0 to +/−50 Oe. Each cell was a 2.7 um by 1.2 um hexagon (e.g., FIG. 5), with its easy axis arranged parallel to its long edge. The applied easy access fields (He) were insufficient to reverse the underlying reference region, and positive easy axis fields anti-aligned the free and reference regions, thus resulting in a higher resistance (MR %).

Significant problems can be identified for hard axis bias Hh=0 Oe to +/−10 Oe, including the lack of similarity of the loops for the various cells, and the lack of an identifiable loop area (358, 356). A noticeable improvement can be observed at hard axis bias Hh=+/−20 Oe, and a reasonable loop area 354 can be identified for this hard axis bias. Further increases in hard axis bias result in smoother and more consistently-shaped loops, but at the expense of squareness and loop area (350, 352).

Figure 6A:
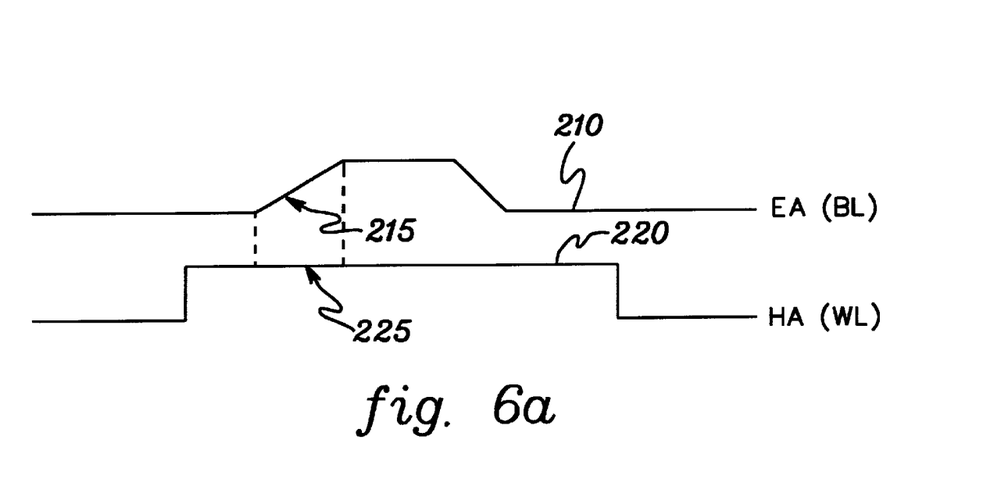
Figure 8A:
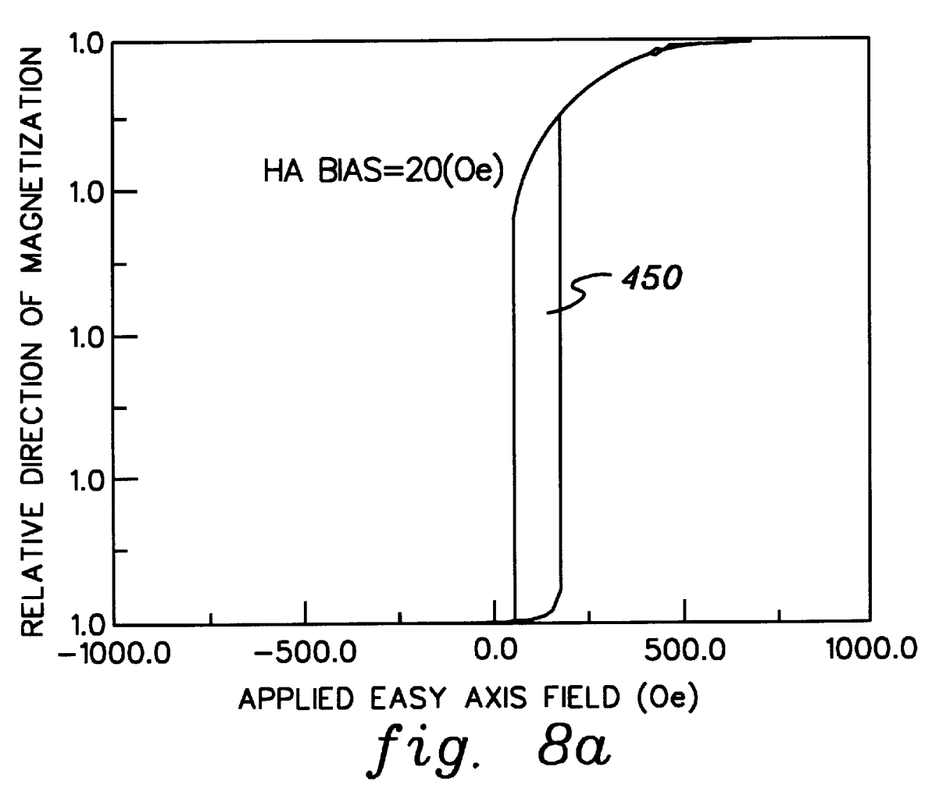
FIG. 8a is a simulated hysteresis loop for a constant hard axis bias of 20 Oe.
Figure 8B:
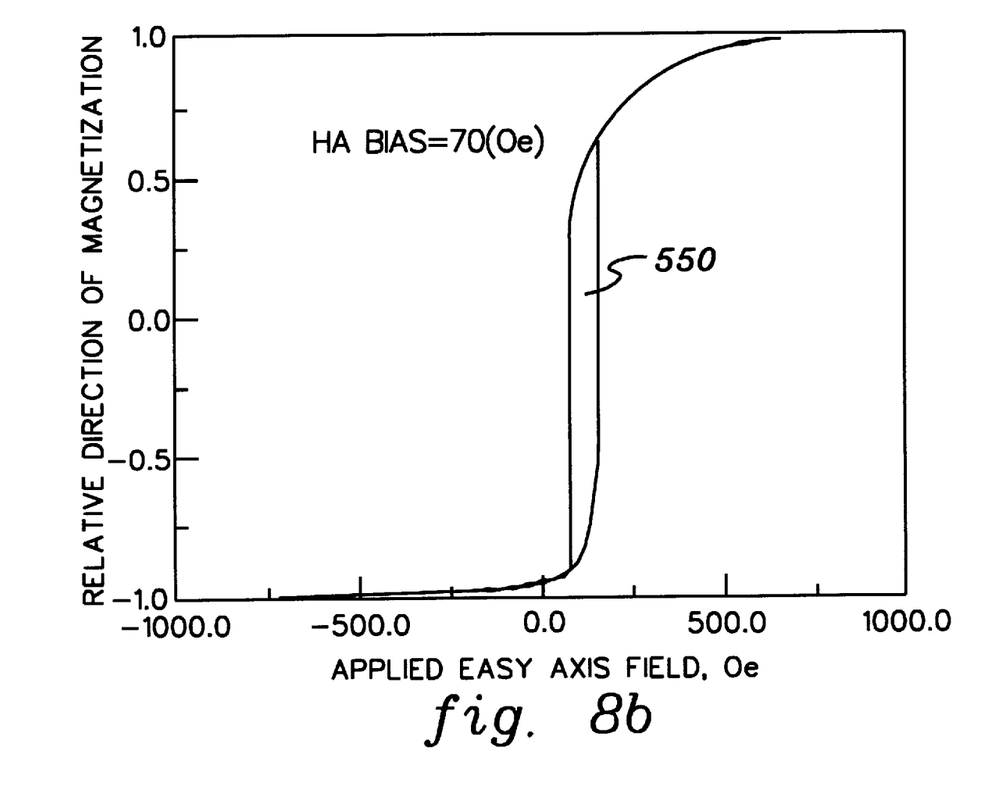
FIG. 8b a simulated hysteresis loop for a constant hard axis bias of 70 Oe.

In addition to these measurements, the response of an otherwise symmetric junction to stimulus asymmetry using the constant hard axis bias of FIG. 6a was also simulated. The simulation results for a 1×0.5 um sample of permalloy layers each 70 Angstroms thick are shown in FIGS. 8a and 8b for a hard axis bias of 20 and 70 Oe, respectively. Inspection of the micromagnetic structure in each case revealed that a wall structure had evolved with no external bias, but that with a bias of 20 Oe and above, the rotation of magnetization which occurred upon bias field reversal was antisymmetric without adverse micromagnetic structures, and smooth hysteresis loops therefore formed.

Figure 6B:
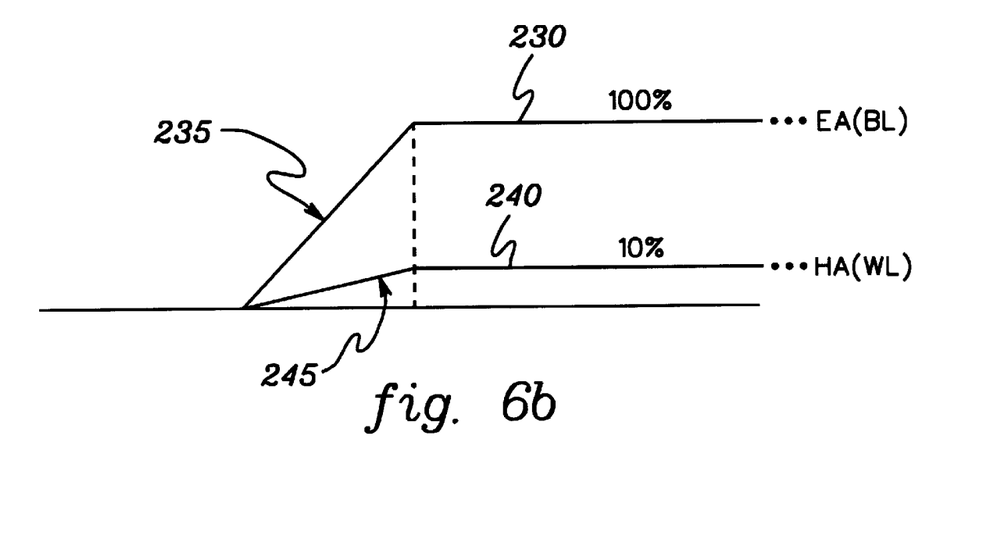

The stimulus asymmetry of the present invention can also be realized during operation by using both swept easy axis and hard axis fields, resulting in a uniformly increasing, summed field being applied at an angle with respect to the easy axis. This technique is illustrated in FIG. 6b, in which, according to the principles of the present invention, easy axis field 230 is swept 235 from a first value to a second value. Hard axis field 240 is similarly swept 245 during this interval, but at a lower range of values, e.g., 10% of the easy axis value. The resultant angle of magnetic field application must be sufficient so that, at the field strength at which symmetry of the magnetization is clearly established, there is a sufficient component of hard axis field to ensure asymmetric evolution of the pattern. The inventors have found that 5–10 degrees of off-axis angle is adequate for cells they have studied. The 10% difference in amplitudes of FIG. 6b results in an angle of arctan (0.1/1.0) or about 5.7 degrees, with respect to the easy axis.

Other forms of stimulus asymmetry can be appreciated by those skilled in the art, which depend upon junction shape, etc. In general, the stimulus asymmetry of the present invention involves any predetermined varying of the amplitude and/or timing of the applied easy axis and hard axis fields to cause a predictable magnetization pattern evolution in the cell.

In addition to the forms of stimulus asymmetry discussed above, i.e., varying the amplitude and/or timing of the applied easy and hard axis fields, asymmetry can also be physically designed into the junction. This technique requires that the junction properties be designed to incorporate some form of physical shape and/or magnetic asymmetry therein.

Figure 9:
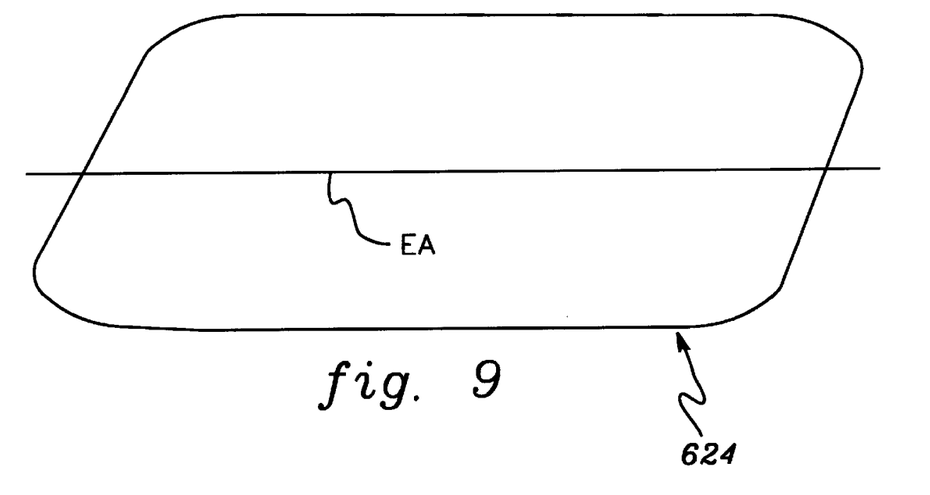
FIG. 9 is a top plan view of a magnetic memory cell formed in accordance with the physical asymmetry principles of the present invention, having an asymmetric shape about its easy axis.

In accordance with the principles of the present invention, and as shown in the top view of a junction in FIG. 9, an asymmetric cell design about an easy axis EA can be realized in which the cell shape itself is distorted into a parallelogram, having non-right angle corners. Simulations performed for this type of structure for a sweeping easy-axis field and no hard-axis bias field showed a strong preference for the asymmetric magnetization which matches the device shape, and therefore a corresponding clean hysteresis loop.

Figure 10:
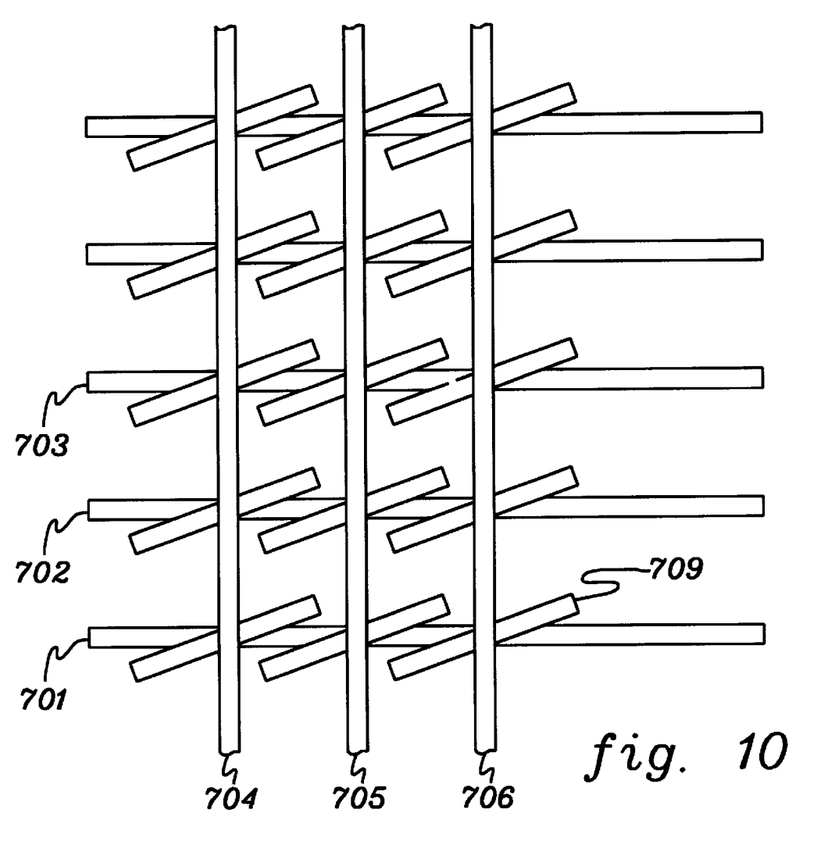
FIG. 10 is a top view of a magnetic memory array formed in accordance with the physical asymmetry principles of the present invention in which cells are formed at the intersections of bitlines and wordlines, each cell having its easy axis non-parallel to either the bitlines or the wordlines.

Another technique for imposing asymmetry in the cell layout is depicted in FIG. 10. As set forth above, magnetic memory cells are normally placed at the intersections of wordlines 701, 702 and 703, and bitlines 704, 705 and 706. Cell 709, placed at the intersection of wordline 701 and bitline 706, is positioned at an angle with respect to the field being applied by the bitline such that its easy axis (along its elongated shape) forms an angle (e.g., 5–10 degrees) with the applied, reversible magnetic field from bitline 706. The cell is therefore non-perpendicular to the bitline 706 providing the reversible magnetic writing field by, e.g., about 5–10 degrees.

In yet another technique for imposing the physical asymmetry of the present invention, a built-in magnetic anisotropy can be imposed in an otherwise symmetric junction which breaks the magnetic junction symmetry, providing a type of magnetic asymmetry similar to the types of asymmetry discussed above, but without the need to distort the actual layout of the cell.

Alternatively, a magnetic bias can be introduced to break the magnetic symmetry.

Figure 11A:
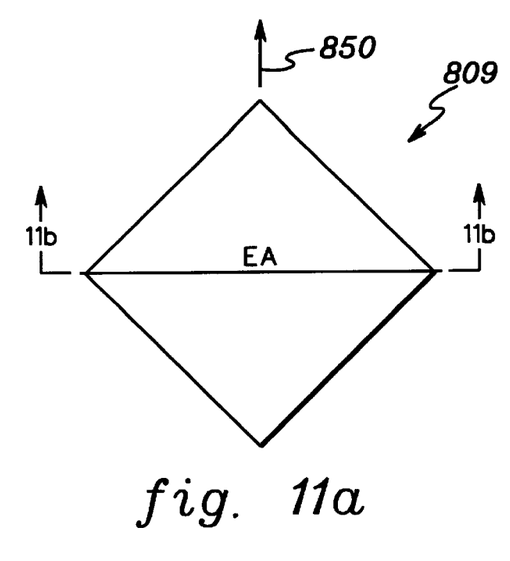
FIGS. 11a–b are a top plan, and cross-sectional view, respectively, of a magnetic memory cell formed in accordance with the physical asymmetry principles of the present invention in which a built-in magnetic bias is used to break the magnetic asymmetry in an otherwise symmetrically shaped cell.
Figure 11B:
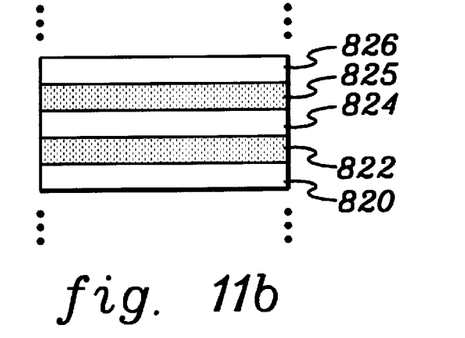

For example, and with reference to FIGS. 11a–b, a cell 809 otherwise symmetrically shaped about its easy axis can have a built-in magnetic bias 850 imposed thereon to maintain a preferred direction of magnetization at the corners thereof. This bias can be along the perpendicular, hard axis.

With reference to the cross-sectional view of FIG. 11b, this built-in magnetic bias can be provided using a bias layer 826, separated from the changeable region 824, tunnel layer 822, and reference region 820, by an optional conducting layer 825.

Figure 12A:
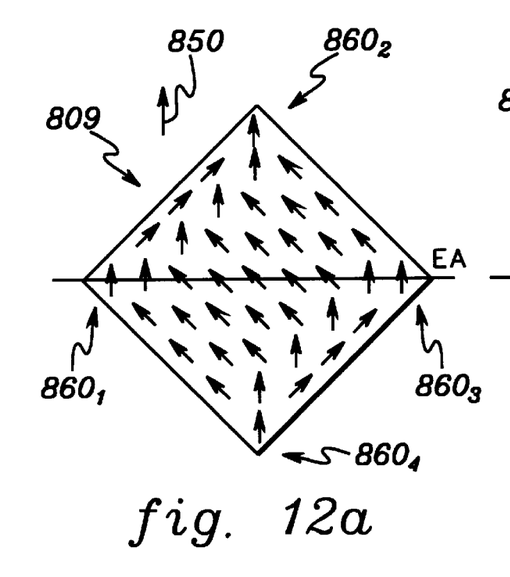
FIGS. 12a–b depict the two possible directions of magnetization of the biased, magnetically asymmetric cell of FIGS. 11a–b.
Figure 12B:
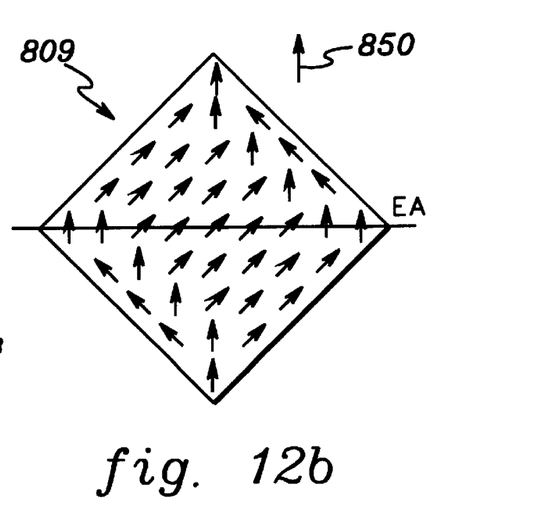

With reference to FIGS. 12a–b, two respective directions of magnetization along the easy axis (EA) can still be imposed (not directly opposing, but at about 45° from the easy axis), however, the magnetic bias 850 pins the corners 860 of the square-shaped cell, thereby facilitating the reversal of magnetization direction in the cell. The bias 850 provides a magnetic asymmetry about the easy axis, which in turn facilitates the direction reversal without adverse micromagnetic structures forming in the cell.

By maintaining a shape symmetry, but imposing a magnetic asymmetry, density of cells in an array will not be adversely impacted.

The same techniques used to form the cells disclosed in the above incorporated U.S. Patents can be used to form the physically asymmetric cells of the present invention by distorting the cell layout and/or building in a magnetic anisotropy at the proper step in the processing. In this regard, the present invention also relates to the fabrication of the physically asymmetric cells discussed above.

Those skilled in the art can appreciate that any combination of the above stimulus and physical asymmetry techniques can be used to ensure proper magnetization pattern evolution.

Figure 13:
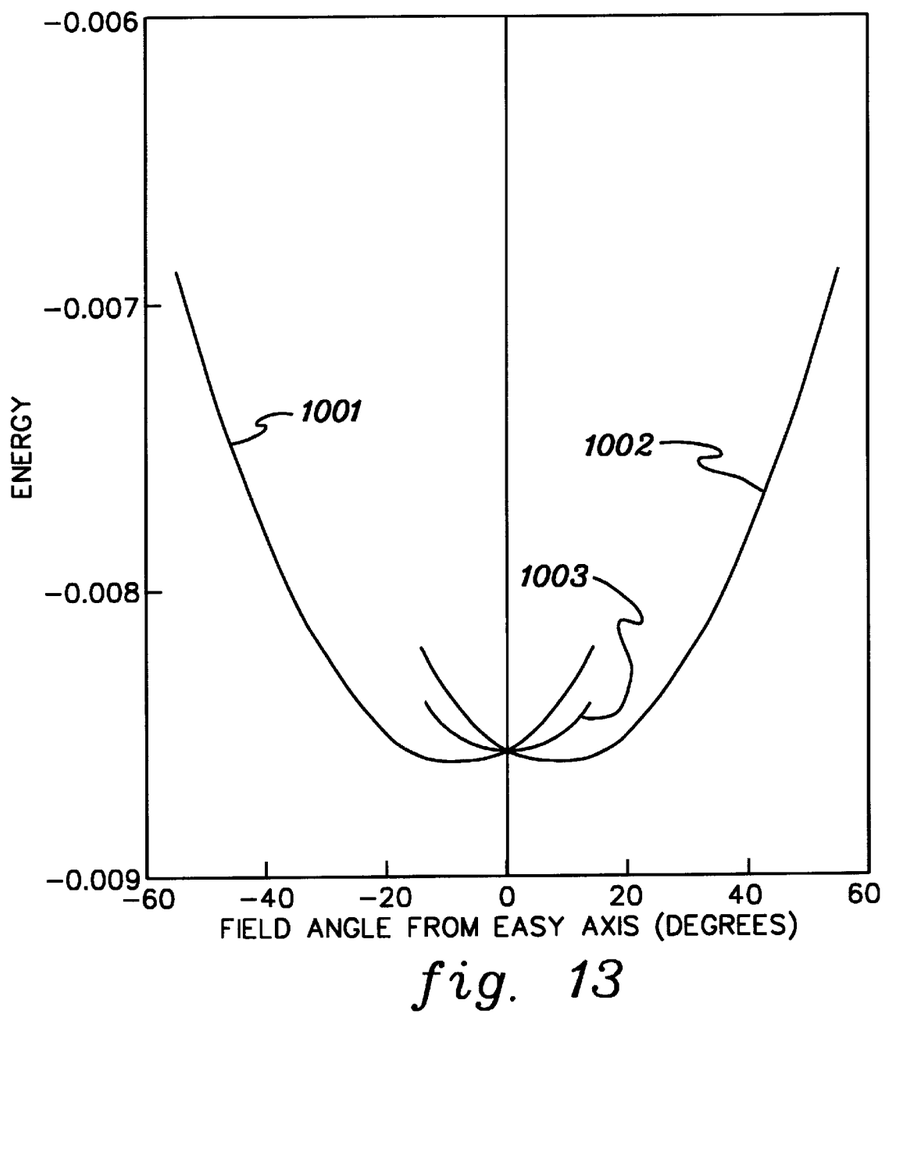
FIG. 13 is an energy diagram of three different states of a magnetic memory cell which intersect upon the removal of the applied easy axis field, indicating an unpredictable state of the magnetic memory cell.
Figure 14:
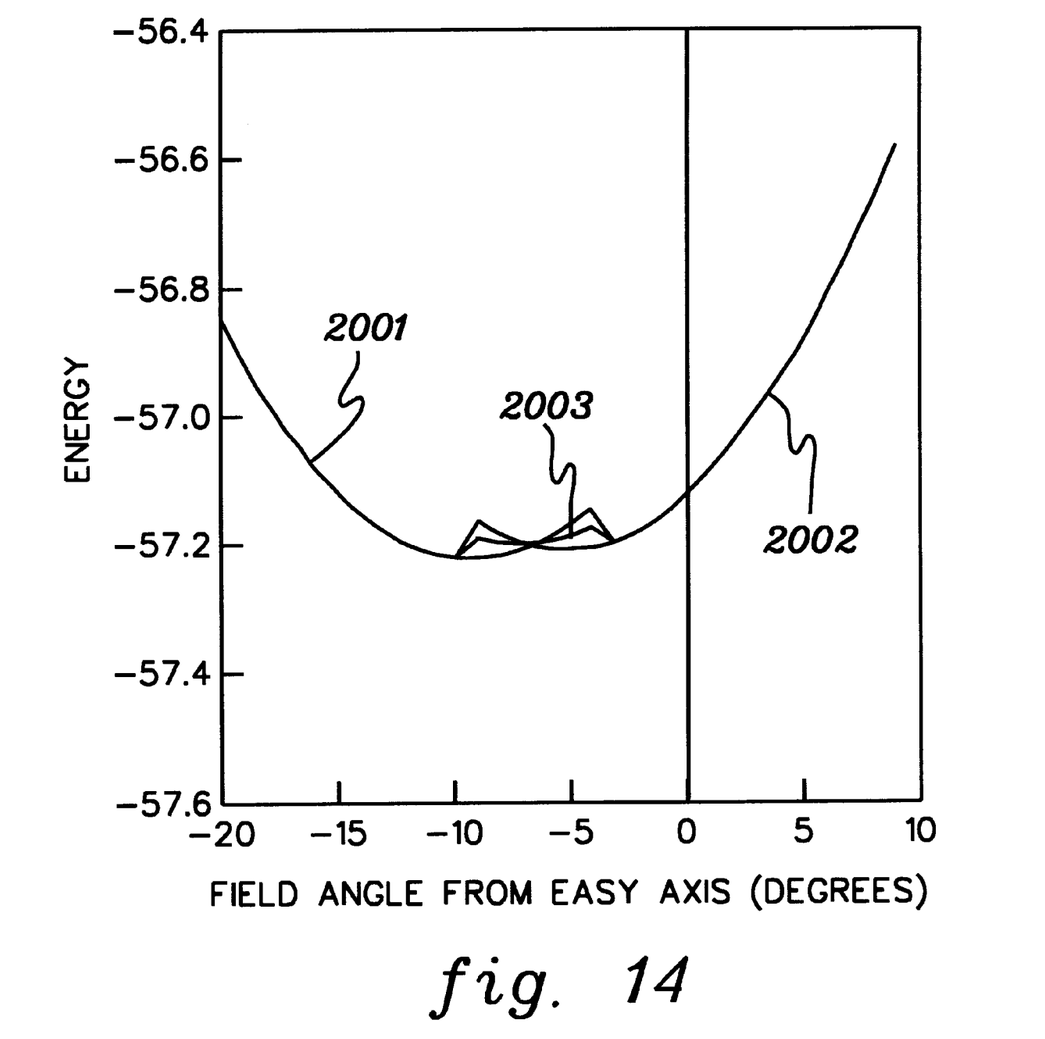
FIG. 14 is an energy diagram of a magnetic memory cell formed according to the principles of the present invention, which attains a predictable state upon the removal of the easy axis field.

An illustration of the benefits of asymmetry provided in accordance with the present invention is evident from an examination of FIGS. 13 and 14. The energy for one symmetric and two asymmetric simple states typically observed was calculated as the hysteresis loop is initiated from a fully magnetized state. The energy calculation for a symmetric junction is shown in FIG. 7, having asymmetric states 1001, 1002, and symmetric state 1003. The energy for an asymmetric junction, including asymmetric states 2001 and 2002, and symmetric state 2003, is shown in FIG. 14. The energy of these states is plotted versus the applied field angle from the easy axis in degrees. For zero applied bias, the asymmetric junction energy levels of FIG. 14 illustrate that there is a clear separation of energy for all three states, and that one asymmetric state, 2002, in particular is favored to evolve. In contrast, for the symmetric junction of FIG. 7, for zero applied bias there is no difference in energy levels for any of the three possible states of the junction, which results in an ambiguity about the micromagnetic state which is favored to evolve. Asymmetrically altering the junction shape is therefore shown to encourage the evolution of a predictable magnetization pattern.

The principles of the present invention can be used alone, on in combination with others disclosed in the above-identified, co-filed U.S. Patent Applications. For example, a multiple junction approach can be combined as disclosed in the above-incorporated U.S. Pat. Application entitled "MAGNETIC MEMORY DEVICES HAVING MULTIPLE MAGNETIC TUNNEL JUNCTIONS THEREIN." Further, by restricting the magneto-resistive electrical interaction to a preferred portion of the changeable magnetic region(s), improved hysteresis loops can be achieved in accordance with the principles of the above-incorporated U.S. Pat. Application entitled "LIMITING MAGNETORESISTIVE ELECTRICAL INTERACTION TO A PREFERRED PORTION OF A CHANGEABLE MAGNETIC REGION IN MAGNETIC DEVICES." Also, the magnetic writing fields can be limited to a preferred portion of the changeable magnetic region(s) in accordance with the principles of the above-incorporated U.S. Pat. Application entitled "LIMITING MAGNETIC WRITING FIELDS TO A PREFERRED PORTION OF A CHANGEABLE MAGNETIC REGION IN MAGNETIC DEVICES."

While the invention has been particularly shown and described with reference to preferred embodiment(s) thereof, it will be understood by those skilled in the art that various changes in form and details may be made therein without departing from the spirit and scope of the invention.

What is claimed is:

1. A magnetic memory, comprising:

first and second crossing conductive lines forming an intersecting region; and a magnetic memory cell disposed at said intersecting region and comprising a changeable magnetic region with a magnetic axis along which two directions of magnetization can be imposed, thereby providing two respective states into which the cell is changeable according to magnetic stimuli applied thereto via the first and second crossing conductive lines, the changeable magnetic region being substantially magnetically asymmetrically shaped about its magnetic axis.

2. The magnetic memory of claim 1, wherein the changeable magnetic region of the magnetic memory cell is shaped as a substantially planar parallelogram about its magnetic axis with non-right angles in the corners thereof.

3. The magnetic memory of claim 1, wherein the magnetic memory cell is disposed in the intersecting region such that the magnetic axis thereof is parallel to one of the first and second crossing conductive lines.

4. The magnetic memory of claim 1, wherein the changeable magnetic region is magnetically asymmetrically shaped about its magnetic axis via a built-in magnetic anisotropy.

5. The magnetic memory of claim 1, further comprising:

a magnetic bias region proximate the changeable magnetic region to provide a bias to provide the magnetically asymmetric shape about said magnetic axis.

6. The magnetic memory of claim 5, wherein the changeable magnetic region is shaped substantially as a square having the magnetic axis aligned between a first pair of opposing corners of the square, and wherein the bias is aligned along a second pair of opposing corners of the square, wherein the bias maintains a common direction of magnetization at all four corners of the square thereby providing the magnetic asymmetry of the changeable magnetic region about the magnetic axis, and wherein the two directions of magnetization are imposed in the interior portion of the square changeable region.

7. The magnetic memory of claim 1, further comprising:

first and second pluralities of crossing conductive lines, including said first and second crossing conductive lines, forming a plurality of intersecting regions, including said intersecting region; and a plurality of magnetic memory cells, including said magnetic memory cell, each disposed at a respective one of the plurality of intersecting regions and each being substantially magnetically asymmetrically shaped about a magnetic axis thereof along which two directions of magnetization can be imposed to provide two respective states into which each cell is changeable.

8. The magnetic memory of claim 1, wherein the two directions of magnetization along the magnetic axis directly oppose one another.

9. The magnetic memory of claim 1, wherein the magnetic memory cell is formed from at least one magnetic tunnel junction.

10. A magnetic memory, comprising:

first and second crossing conductive lines forming an intersecting region; and a magnetic memory cell disposed at said intersecting region and having a magnetic axis along which two directions of magnetization can be imposed thereby providing two respective states into which the cell is changeable according to magnetic stimuli applied thereto via the first and second crossing conductive lines, the cell disposed in said intersecting region such that said magnetic axis is non-parallel to either said first or said second crossing conductive line.

11. The magnetic memory of claim 10, further comprising:

first and second pluralities of crossing conductive lines, including said first and second crossing conductive lines, forming a plurality of intersecting regions, including said intersecting region; and a plurality of magnetic memory cells, including said magnetic memory cell, each disposed at a respective one of said plurality of intersecting regions and each having a magnetic axis along which two directions of magnetization can be imposed thereby providing two respective states into which each cell is changeable according to magnetic stimuli applied thereto via the respective first and second crossing conductive lines forming the respective intersecting region, each respective cell disposed in its respective intersecting region such that its magnetic axis is non-parallel to either its respective first or its respective second crossing conductive line.

12. The magnetic memory of claim 10, wherein the magnetic axis forms an angle of greater than about 5 degrees with either said first or said second crossing conductive line.

13. In a magnetic memory having a magnetic memory cell therein which includes a changeable magnetic region with a magnetic axis along which two directions of magnetization can be imposed, thereby providing two respective states into which the cell is changeable according to magnetic stimuli applied thereto, a method for changing the changeable magnetic region between the two directions of magnetization, comprising:

applying the magnetic stimuli to the changeable region in a direction non-parallel to the magnetic axis.

14. The method of claim 13, wherein said applying includes using a line arranged relative to said magnetic axis such that the resultant magnetic stimuli is applied to the changeable region in the direction non-parallel to the magnetic axis.

15. The method of claim 14, wherein the line and the changeable magnetic region are arranged such that the magnetic axis is not perpendicular to the line.

16. The method of claim 15, wherein the line and the changeable magnetic region are arranged such that the magnetic axis is not perpendicular to the line by more than about 5 degrees.

17. The method of claim 13, wherein said applying includes:

using first and second magnetic stimuli from respective first and second lines crossing proximate said cell, said direction of said magnetic stimuli attained according to respective magnitudes and/or timing of the first and second magnetic stimuli.

18. The method of claim 17, wherein said using first and second magnetic stimuli includes:

simultaneously sweeping both the first and second magnetic stimuli from respective first values to respective second values such that the intervening values of the second magnetic stimuli comprise a fixed percentage of the respective intervening values of the first magnetic stimuli, thereby resulting in the magnetic stimuli being applied in said direction non-parallel to the magnetic axis.

19. The method of claim 18, wherein said fixed percentage is about 10%, such that said direction non-parallel to the magnetic axis is about 5 degrees.

20. The method of claim 18, wherein the first and second lines cross perpendicular to each other proximate said cell such that the first and second magnetic stimuli are applied perpendicular to each other, one of said lines being parallel to said magnetic axis.

21. In a magnetic memory having a magnetic memory cell therein which includes a changeable magnetic region with a magnetic axis along which two directions of magnetization can be imposed, thereby providing two respective states into which the cell is changeable according to magnetic stimuli applied thereto, a method for changing the changeable magnetic region between the two directions of magnetization, comprising:

applying the magnetic stimuli to the changeable region, including using first and second magnetic stimuli from respective first and second lines crossing proximate said cell, said direction of the magnetic stimuli attained according to respectively varying amplitudes and/or timing of the first and second magnetic stimuli.

22. The method of claim 21, wherein said using first and second magnetic stimuli includes:

sweeping the first magnetic stimulus from a first value to a second value while holding the second magnetic stimulus to a constant value.

23. The method of claim 22, wherein the first and second lines cross perpendicular to each other proximate said cell such that the first and second magnetic stimuli are applied perpendicular to each other, one of said lines being parallel to said magnetic axis.

* * * * *

UNITED STATES PATENT AND TRADEMARK OFFICE
CERTIFICATE OF CORRECTION

PATENT NO. : 6,104,633
DATED : August 15, 2000
INVENTOR(S) : Abraham et al.

It is certified that error appears in the above-identified patent and that said Letters Patent are hereby corrected as shown below:

IN THE SPECIFICATION:

Col. 4, line 21, delete "FIGS. 6a-h" and replace with --FIGS. 6a-b--.

Col. 4, line 51, delete "and" after FIGS. 11a-b;.

Signed and Sealed this

Seventeenth Day of April, 2001

Attest:

NICHOLAS P. GODICI

Attesting Officer        Acting Director of the United States Patent and Trademark Office